(12) United States Patent
Takase

(10) Patent No.: US 7,183,862 B2
(45) Date of Patent: Feb. 27, 2007

(54) SYSTEM AND METHOD FOR PHASE-LOCKED LOOP LEAK COMPENSATION

(75) Inventor: Satoru Takase, Round Rock, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 49 days.

(21) Appl. No.: 11/136,817

(22) Filed: May 25, 2005

(65) Prior Publication Data

US 2006/0267691 A1 Nov. 30, 2006

(51) Int. Cl.
*H03L 7/089* (2006.01)
(52) U.S. Cl. .................. 331/17; 331/25; 327/157
(58) Field of Classification Search ............ 331/1 A, 331/8, 16–18, 25; 327/156–159; 332/127; 360/51; 375/376; 455/260
See application file for complete search history.

(56) References Cited

U.S. PATENT DOCUMENTS 5,783,972 A 7/1998 Nishikawa 6,377,127 B1* 4/2002 Fukaishi .................. 331/17

FOREIGN PATENT DOCUMENTS

JP 2000-224035 A 8/2000

* cited by examiner

*Primary Examiner*—David Mis
(74) *Attorney, Agent, or Firm*—Sprinkle IP Law Group

(57) ABSTRACT

Phased-lock loop (PLL) system and method for compensating current leakage where current leakage may include gate-leak current attributable to a gate capacitor. In particular, providing a compensation current to an input node of a voltage-controlled oscillator (VCO) to substantially compensate current leakage and therefore reduce PLL jitter. The PLL circuit includes a compensation charge pump which receives input from a counter and in turn provides a counter-value-proportional compensation current. The counter value increments and decrements according to up and down inputs from a phase frequency detector. The counter value is fixed when the PLL circuit is locked. The PLL circuit is driven to lock by the compensation charge pump, with or without the aid of another charge pump. While the PLL is locked, the compensation charge pump may provide a fixed counter-value-proportional compensation current.

31 Claims, 2 Drawing Sheets

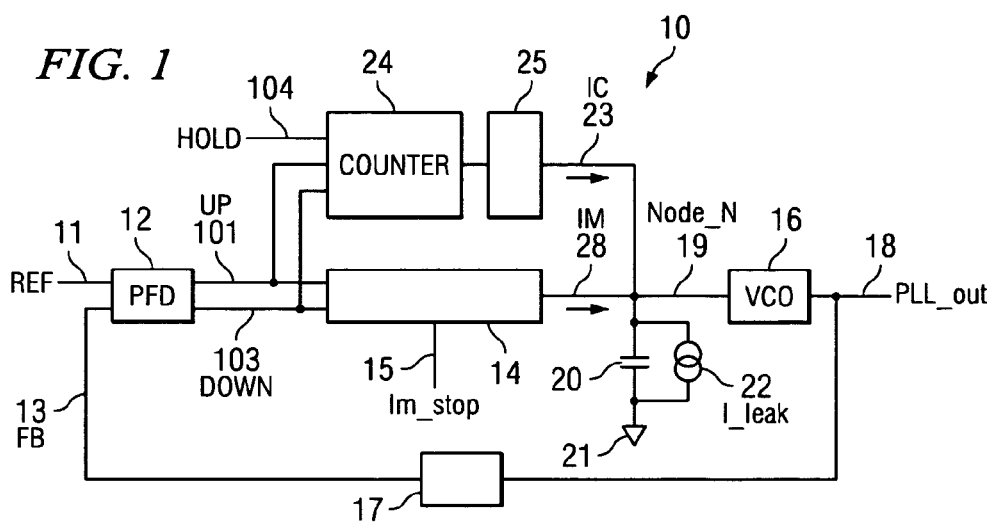
*FIG. 1*
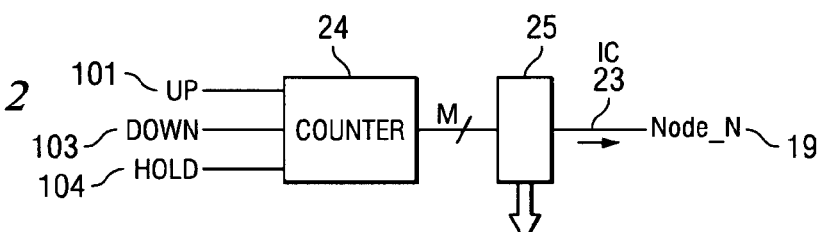
*FIG. 2*
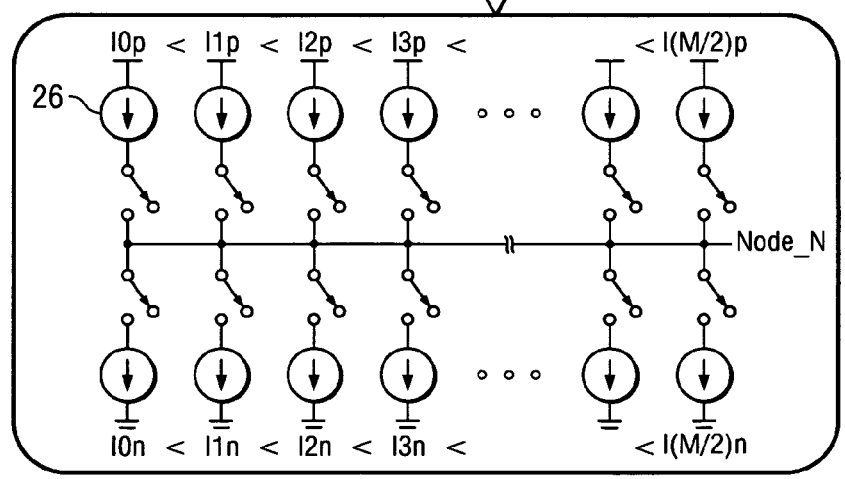
*FIG. 4*
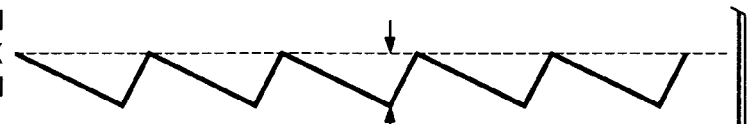
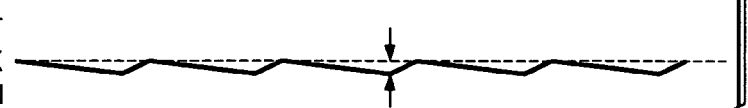

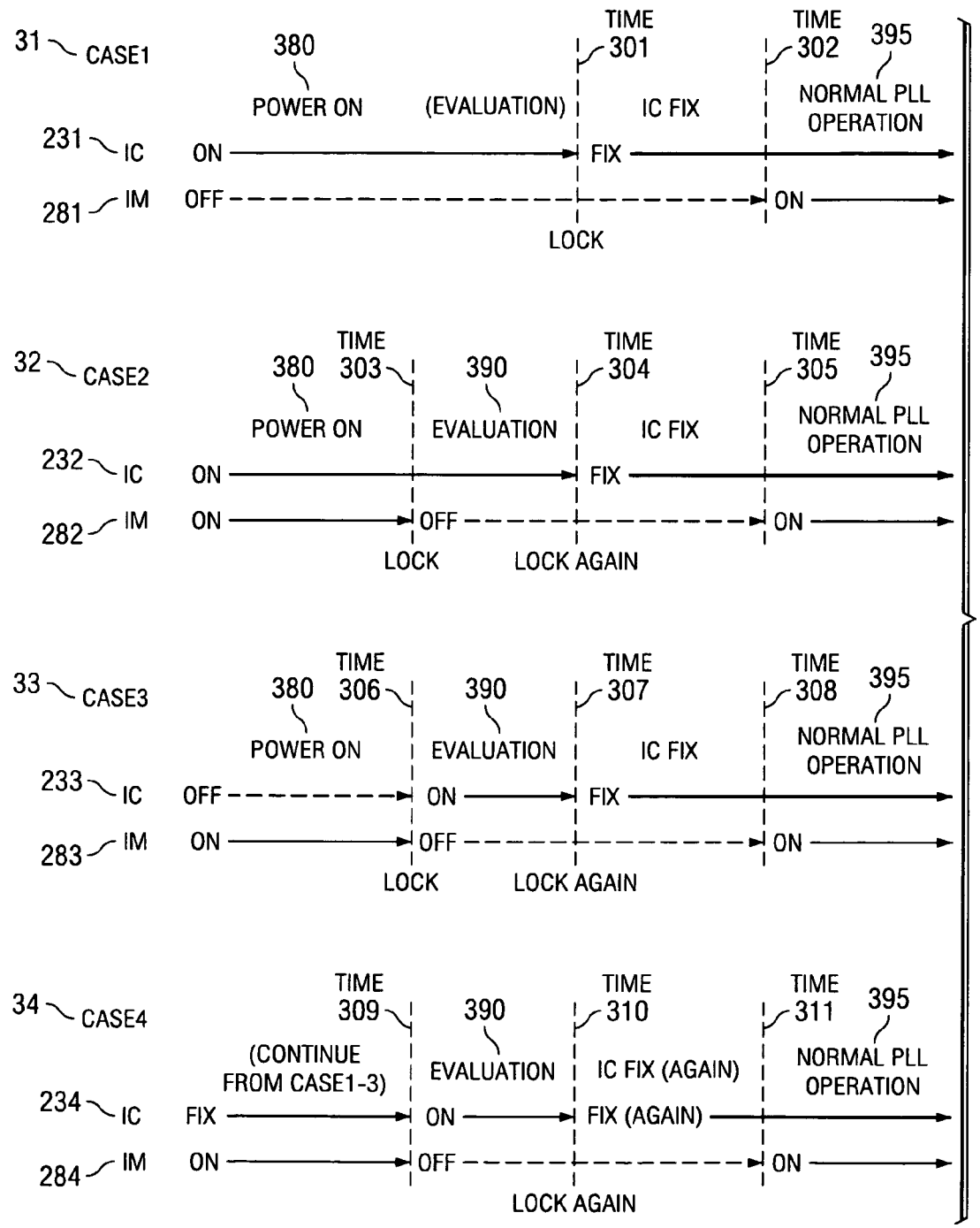

SYSTEM AND METHOD FOR PHASE-LOCKED LOOP LEAK COMPENSATION

TECHNICAL FIELD OF THE INVENTION

The present invention relates to a phase-locked loop circuit, and more particularly, to reducing phase-locked loop circuit jitter by compensating for current leakage.

BACKGROUND OF THE INVENTION

Phase-locked loops are widely used in digital electronics, signal telemetry, and communications applications. A typical phase-locked loop may include a phase-frequency detector, a charge pump, and a voltage-controlled oscillator.

Phase-locked loop integrated circuits produce an oscillator frequency output signal. This oscillator frequency output signal either matches an input frequency signal or can be frequency divided to match an input frequency signal. The oscillator frequency output signal relies upon the voltage at an input node of a voltage-controlled oscillator (VCO) of the phase-locked loop. The phase-locked loop is very sensitive to noise at the input node to the VCO. Consequently, a typical phase-locked loop may include a capacitor between the input node to the VCO and ground. In phase-locked loop circuits manufactured using CMOS technologies, the capacitor used to stabilize the voltage at the input node to the VCO may be a gate capacitor. CMOS technologies continually shrink; consequently gate oxide thicknesses are continually decreasing. Gate capacitors may experience some gate current leakage, and this leakage current is sometimes considered negligible. However, as gate capacitors' gate oxide thicknesses decrease, gate leakage current becomes non-negligible. Therefore, a gate capacitor intended to stabilize the input voltage to a VCO may contribute to voltage fluctuation at the input node to the VCO due to gate leakage current. Accordingly, it is desirable to compensate for such current leakage in a phase-locked loop circuit.

SUMMARY OF THE INVENTION

Systems and methods for compensating for current leakage in a phase-locked loop (PLL) are disclosed. These systems and methods compensate for current leak at an input node at a voltage-controlled oscillator (VCO), thus reducing phase-locked loop jitter.

Phased-lock loop system and method for compensating current leakage where current leakage may include gate-leak current attributable to a gate capacitor. In one embodiment, these systems and methods can provide a compensation current to an input node of a voltage-controlled oscillator (VCO) to substantially compensate current leakage and therefore reduce phase-locked loop jitter. In this embodiment, the phase-locked loop circuit includes a compensation charge pump which receives input from a counter and in turn provides a counter-value-proportional compensation current. The counter value increments and decrements according to UP output signal and DOWN output signal from a phase detector. The counter value is fixed when the PLL circuit is locked. The PLL circuit is driven to lock by the compensation charge pump, with or without the aid of another charge pump. While the PLL is locked, the compensation charge pump may provide a fixed counter-value-proportional compensation current.

In an embodiment, a phase-locked loop includes a phase-frequency detector, a counter, a first charge pump, a second charge pump, and a voltage-controlled oscillator. The phase-frequency detector receives a reference input and a feedback input. The phase-frequency detector generates UP output signal and DOWN output signal and these output signals are provided to a counter. A counter value is determined from the UP output signal and the DOWN output signal. The counter value is provided to the first charge pump, which in turn produces an output signal proportional to the counter value. The second charge pump receives the UP output signal and the DOWN output signal generated by the phase-frequency detector, and from them provides an output signal. The voltage controlled oscillator receives the output signals generated from the first and second charge pumps.

The phase-locked loop of this embodiment may include a capacitor arranged between the input node to the voltage-controlled oscillator and ground. Also, this phase-locked loop embodiment may include additional inputs, such as a HOLD input port wherein the counter is configured to maintain a constant counter value when HOLD is asserted, and a STOP input port, wherein the phase-locked loop is configured to inactivate the second charge pump when STOP is asserted.

In another embodiment, a phase-locked loop circuit includes a counter holding a value, where the counter value is acted upon by a phase-frequency detector. Also included in this embodiment is a first charge pump configured to provide a first output signal to an input node of a voltage-controlled oscillator. This first output signal is proportional to the counter value, and this first output signal substantially compensates a current loss from the input node of the voltage-controlled oscillator. The counter value is held substantially constant while the counter's HOLD input is asserted. Also included in the phase-locked loop of this embodiment may be a capacitor arranged between the input node to the voltage-controlled oscillator and ground. This capacitor may be a gate capacitor having a gate-leak current contributing to current loss from the input node of the voltage-controlled oscillator.

In an embodiment, a method of configuring a phase-locked loop (PLL) circuit which includes providing a compensation current to an input node of a voltage-controlled oscillator where the compensation current is substantially equivalent to a leakage current from the input node to the voltage-controlled oscillator. The method includes providing an additional charge pump to the PLL and configuring the additional charge pump to provide a current which compensates current loss from the VCO input. Configuring the additional, compensation charge pump may include locking the PLL while the compensation charge pump is active and asserting a HOLD input to the charge pump while the PLL is locked. The compensation current may remain constant while the HOLD input is asserted. Locking the PLL may include locking the PLL at least twice before asserting the HOLD input. Further, locking the PLL may include locking the PLL at least once while the compensation charge pump is not active. Still further, determining the compensation current may include re-determining the compensation current by unasserting the HOLD input and re-locking the PLL.

Thus, an improved PLL circuit is provided. The PLL circuit is configured to determine and provide a compensation current such that current leakage is substantially compensated, thereby potentially reducing PLL jitter. Thereby, the disclosed PLL circuit provides the advantage of potentially reducing PLL jitter such as may be caused by current leakage from an input node to a voltage-controlled oscillator. In particular, current leakage attributed to a gate capacitor arranged between an input node to a voltage-controlled oscillator and ground may be reduced.

Other technical advantages of the invention include the existence of multiple methods for determining a compensation current and the ability to re-determine the compensation current. The compensation current may be re-determined at a user-defined interval or as requested.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

The drawings accompanying and forming part of this specification are included to depict certain aspects of the invention. A clearer impression of the invention, and of the components and operation of systems provided with the invention, will become more readily apparent by referring to the exemplary, and therefore nonlimiting, embodiments illustrated in the drawings, wherein identical reference numerals designate the same components. Note that the features illustrated in the drawings are not necessarily drawn to scale.

FIG. 1 is a block diagram of an embodiment of a phase-locked loop circuit according to the invention.

FIG. 2 is a block diagram of an embodiment of a leak compensation charge pump according to the invention.

FIG. 3 is a timing diagram for methods for determining the value of a compensation current, which may be used with embodiments of the invention.

FIG. 4 is a graph illustrating an exemplary improvement realized through implementation of one embodiment of the invention.

DETAILED DESCRIPTION

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. It should be understood, however, that the detailed description and the specific examples, while indicating preferred embodiments of the invention, are given by way of illustration only and not by way of limitation. After reading the specification, various substitutions, modifications, additions and rearrangements will become apparent to those skilled in the art from this disclosure which do not depart from the scope of the appended claims.

FIG. 1 is a block diagram of one embodiment of a phase-locked loop (PLL) circuit according to the present invention. PLL 10, as shown in FIG. 1, includes phase-frequency detector (PFD) 12, charge pump 14, and voltage-controlled oscillator (VCO) 16. PFD 12 compares phase and frequency of reference signal REF 11 with phase and frequency of feedback signal FB 13. PFD 12 generates difference signals from the comparison of REF 11 and FB 13.

Phase-frequency detector 12 generates positive difference signal UP 101 and negative difference signal DOWN 103. These difference signals are generated from the difference between REF 11 and FB 13 detected by PFD 12. UP signal 101 and DOWN signal 103 are provided to charge pump 14. If Im_stop 15 is asserted, substantially no output is generated by charge pump 14. When input port Im_stop 15 is unasserted, charge pump 14 generates a charge according to difference signal UP 101 and difference signal DOWN 103. Charge pump 14 thus generates a signal Im 28 which may be proportional to the difference of the signals input to phase-frequency detector (PFD) 12. The charge generated by charge pump 14 is provided as an input to voltage-controlled oscillator 16. In turn, voltage-controlled oscillator (VCO) 16 generates a periodic signal PLL_out 18. The periodic signal PLL_out 18 is provided as input to divider 17 and divider 17 in turn provides feedback signal FB 13 as input to PFD 12.

As shown in FIG. 1, Node_N 19 is the node arranged at the input to VCO 16. Thus, Node_N 19 is the input node to VCO 16. Periodic signal PLL_out 18 is highly dependent upon the voltage at Node_N 19. Voltage fluctuation at Node_N 19 may contribute to PLL jitter. Capacitor 20 may be arranged between Node_N 19 and ground 21 to reduce or substantially eliminate PLL jitter. Capacitor 20 may be a gate capacitor which may experience gate current leakage I_leak 22.

As gate oxide thicknesses become smaller, gate current leakages becomes greater. The current invention may be used with process technologies having a minimum half pitch of less than about 90 nm and gate oxide thicknesses of less than about 15 angstroms. For example, some current process technologies use a gate oxide thickness of about 10 angstroms. Therefore, gate current leakage I_leak 22 may be non-negligible. I_leak 22 may contribute to current leakage from VCO input node Node_N 19. Current leakage from the input node to a voltage-controlled oscillator may contribute to voltage fluctuation at the input node to the voltage-controlled oscillator. Thus, gate capacitor 20 may contribute to voltage fluctuation at VCO input node Node_N 19. Consequently, I_leak 22 may contribute to PLL jitter.

Compensation current Ic 23 may be provided to compensate for current loss from Node_N 19. In particular, a compensation current for gate leak current I_leak 22 may be provided. Compensation current Ic 23 may be generated by compensation charge pump 25 using input from counter 24. Counter 24 receives current sources UP 101 and DOWN 103 as inputs. Counter 24 includes a value which may increment each time a pulse is received from input signal UP 101. Similarly, the value held by counter 24 may decrement each time a pulse is received from input signal DOWN 103. Further, the value in counter 24 may remain constant when HOLD input port 104 is asserted. Compensation charge pump 25 generates output current Ic 23, where Ic 23 is substantially proportional to the value held by counter 24. When the value held by counter 24 changes, output Ic 23 can change. Therefore, output Ic 23 may be constant when the value held by counter 24 remains constant.

FIG. 2 is a block diagram of an embodiment of a leak compensation charge pump which may be used with embodiments of the present invention. Leak compensation charge pump 25 can receive multiple lines of input from counter 24. In the embodiment shown, charge pump 25 receives 'M' input lines from counter 24, where 'M' can be any number. Charge pump 25 may include a current source corresponding to and controlled by each input line. Thus, in the embodiment shown, charge pump 25 includes 'M' current sources 26. When hold input port HOLD 104 is unasserted, counter 24 can increment or decrement according to input signal UP 101 and input signal DOWN 103. Similarly, the value of compensation current Ic 23 can increase or decrease according to input signal UP 101 and input signal DOWN 103. The value of counter 24, and thus the value of compensation current Ic 23, may remain fixed when input port HOLD 104 on counter 24 is asserted.

As described below in reference to FIG. 3, compensation current Ic 23, as shown in FIG. 1, may be determined in a variety of ways. FIG. 3 depicts timing diagrams for numerous embodiments 31, 32, 33, and 34 of methods to determine compensation current Ic 23 for a PLL circuit 10 such as shown in FIG. 1. The embodiments may include a power up sequence 380, an evaluation sequence 390, and a normal operation sequence 395. The PLL is started during the power up sequence 380. A value for Ic 23 is determined during the evaluation sequence 390. Ic 23 substantially compensates for current leak from Node_N 19, as shown in FIG. 1, where such current leak may be primarily attributable to gate current leak I_leak 22. Finally, the embodiments include a normal operation sequence 395 in which the PLL operates normally.

In FIG. 3 a first embodiment of a method for determining compensation current is depicted as Case1 31. The compensation current determined by this first method is Ic 231. In Case1 31, charge pump 14 is inactive while compensation charge pump 25 is used to drive PLL 10 to lock during the evaluation sequence 390. Further, compensation current Ic 231 is fixed before charge pump 14 becomes active.

Shown in Case1 31 are Ic 231 and Im 281, representative of the output currents from compensation charge pump 25 and charge pump 14, respectively. In Case1 31, only one of the charge pumps, compensation charge pump 25, is active during the PLL power up sequence 380. As described previously, asserting control signal Im_stop 15 prevents operation of charge pump 14. Thus, control signal Im_stop 15 is asserted during the PLL power up sequence of case1 31.

During the power up sequence 380 of Case1 31 shown in FIG. 3, compensation charge pump 25 is active until PLL 10 locks at time 301. In Case1, when PLL 10 locks at the time labeled 301, Ic 231 is substantially equal to a leakage current from Node_N 19. The leakage current from Node_N 19 may be substantially equivalent to the gate leakage current I_leak 22. Thus, when PLL 10 locks at the time 301 in Case 1, compensation current Ic 231 may be substantially equivalent to gate leakage current I_leak 22.

Compensation current Ic 231 is fixed after PLL lock occurs at time 301. As described above in reference to FIG. 1 and FIG. 2, counter 24 includes HOLD input port 104 configured to hold constant the counter's value when asserted. Therefore, compensation current Ic 231 is held constant by asserting HOLD input port 104 to counter 24 at or after time 301. Therefore, Ic 231 may compensate a constant leakage current from Node_N 19 while HOLD input 104 remains asserted.

In case1 31, the power up sequence ends near the time labeled 301. Also, as Ic 231 is fixed around time 301, the power up sequence 380 and evaluation sequence 390 of Case1 31 occur simultaneously end approximately together at time 301. Since only charge pump 25 is active during the power up sequence of case1 31, charge pump 14 is inactive until after time 301. Therefore, at time labeled 302, control signal Im_stop 15 is un-asserted and charge pump 14 is activated following the power up sequence 380 and evaluation sequence 390. Thus, at the time labeled 302, charge pump 14 is active, compensation charge pump 25 is active, Ic 231 is fixed, and PLL 10 operates normally.

In FIG. 3 a second embodiment of a method for determining compensation current Ic is labeled Case2 32. In Case2 32, charge pump 14 and compensation charge pump 25 are used together to drive PLL 10 to lock during the power up sequence 380 of case2 32. Charge pump 14 is turned off after PLL lock, and compensation charge pump 25 is used to drive PLL 10 to lock a second time during the evaluation sequence 390 of case2 32. When PLL 10 locks a second time, compensation current Ic 232 is fixed, and the PLL operates normally in the normal operation sequence 395 of case2 32.

Shown in Case2 32 are Ic 232 and Im 282, representative of output currents from compensation charge pump 25 and charge pump 14, respectively. In Case2 32, charge pump 14 and compensation charge pump 25 are both active during PLL power up sequence 380. Both remain active until PLL 10 locks for a first time at time labeled 303. Charge pump 14 control signal Im_stop 15 is asserted when PLL 10 locks at or after time labeled 303. Thus, charge pump 14 stops at time 303 and compensation charge pump 25 remains active through evaluation sequence 390 of case2 32.

Compensation charge pump 25 then drives PLL 10 to lock for a second time during evaluation sequence 390 of case2 32 which ends near time labeled 304. In Case2 32, when PLL 10 locks for a second time of the embodiment, Ic 232 is substantially equal to a leakage current from Node_N 19. Leakage current from Node_N 19 may be substantially equivalent to the gate leakage current I_leak 22 at time 304. Thus, when PLL 10 locks for the second time at time labeled 304 in Case 2, compensation current Ic 232 may be substantially equivalent to gate leakage current I_leak 22.

Therefore, asserting HOLD input 104 to counter 24 near time 304 may set Ic 232 to compensate for leakage current from the input node to VCO 16. At the time labeled 305, the normal PLL operation sequence 395 begins and charge pump 14 is activated by un-asserting control signal Im_stop 15. Thus, on or after the time labeled 305, charge pump 14 and compensation charge pump 25 are active, Ic 232 is fixed, and PLL 10 operates normally.

In FIG. 3 a third embodiment of a method for determining compensation current Ic is labeled Case3 33. In Case3 33, charge pump 14 is used to drive PLL 10 to lock while compensation charge pump 25 is not active during PLL power up sequence 380. Charge pump 14 is turned off following a first PLL lock. Compensation charge pump 25 is then activated and used to drive PLL 10 to lock a second time. When PLL 10 locks the second time, compensation current Ic 233 is fixed during evaluation sequence 390.

Shown in Case3 33 are Ic 233 and Im 283, representative of output currents from compensation charge pump 25 and charge pump 14, respectively. In Case3 33, compensation charge pump 25 is inactive and charge pump 14 is active until the first PLL lock at time 306. Charge pump 14 control signal Im_stop 15 is asserted at or after the first PLL lock at time labeled 306.

Thus, charge pump 14 stops at time 306. Also at time labeled 306, compensation charge pump 25 goes active. Compensation charge pump 25 drives PLL 10 to lock for a second time. Therefore, compensation charge pump 25 drives PLL 10 to lock for a second time without the aid of charge pump 14. PLL 10 locks for the second time at time 307. At PLL lock, Ic 233 is substantially equal to a leakage current from Node_N 19 during evaluation sequence 390. Leakage current from Node_N 19 may be substantially equivalent to gate leakage current I_leak 22. Thus, when PLL 10 locks for the second time at the time labeled 307, compensation current Ic 233 may be substantially equivalent to gate leakage current I_leak 22.

Therefore, asserting HOLD input 104 to counter 24 at time 307 may set Ic 233 to compensate for leakage current from Node_N 19. At the time labeled 308, the normal PLL operation sequence begins and charge pump 14 is activated by un-asserting control signal Im_stop 15. Thus, beginning at or after time labeled 308, charge pump 14 and compensation charge pump 25 are active, Ic 233 is fixed, and PLL 10 operates normally.

As shown in each of Case1, Case2, and Case3, normal PLL operation sequence 395 begins at or after times labeled 302, 305, and 308, respectively. During normal operation sequence 395, compensation currents Ic 231, Ic 232, and Ic 233, respectively, are held constant. However, current loss from Node_N 19 may vary over time. For example, gate leak current I_leak 22 may vary over time due to, for example, heat. Because the current loss from Node_N 19 may vary over time, it is therefore desirable to revisit the compensation current and to revisit the evaluation sequence 390.

In FIG. 3 an embodiment of a method for re-determining compensation current Ic 234 is labeled Case4 34. In Case4 34, the compensation current is revisited. To re-evaluate compensation current Ic 234, charge pump 14 is turned off and counter 24 is allowed to change values beginning at time 309. In this way, compensation charge pump 25 is used to relock PLL 10 while the charge pump 14 is not active. When PLL 10 re-locks, compensation current Ic 234 is re-determined by asserting HOLD 104 to counter 24.

Case4 34 may occur at any time following the commencement of normal PLL operation. Shown in Case4 34 are Ic 234 and Im 284 representative of output currents from compensation charge pump 25 and charge pump 14, respectively. In Case4 34, PLL 10 is locked and charge pump 14 and compensation charge pump 25 are active until time labeled 309. At or after time labeled 309, control signal Im_stop 15 is high and HOLD 104 is unasserted. Asserting Im_stop 15 inactivates charge pump 14. Inactivating charge pump 14 turns off current Im 284 such that current Im 284 is effectively zero. Unasserting HOLD input 104 allows the counter value to change with UP signal 101 and DOWN signal 103, thus varying compensation current Ic 234.

While charge pump 14 is inactive and Im 284 is effectively zero, compensation current Ic 234 can be re-determined by allowing compensation charge pump 25 to re-lock PLL 10. PLL 10 re-locks around time 310. Subsequently, HOLD 104 is asserted while PLL 10 is locked at or after time labeled 310. When HOLD 104 is asserted, compensation current Ic 234 is fixed at the re-determined value.

When PLL 10 re-locks at or after time 310 in Case4 34, Ic 234 is substantially equal to a leakage current from Node_N 19. Leakage current from Node_N 19 may be substantially equivalent to gate leakage current I_leak 22. Thus, when PLL 10 locks at or after time labeled 310 in Case4 34, compensation current Ic 234 may again be substantially equivalent to gate leakage current I_leak 22. Therefore, asserting HOLD input 104 to counter 24 at or after time 310 sets Ic 234 to a value which will substantially compensate leakage current from Node_N 19 at time 310.

At the time labeled 311 in Case4 34, the re-evaluation is over and control signal Im_stop 15 is un-asserted. Thus, at or after the time labeled 311, charge pump 14 re-activates such that compensation charge pump 25 and charge pump 14 are both active, compensation current Ic 234 is fixed, and PLL 10 resumes normal operation. Thus, normal operation sequence 395 begins at time 311.

Compensation current Ic 23 re-determination as described by the embodiment Case4 34 may be repeated as deemed necessary. Thus, re-determination may be user-initiated on a case-by-case basis. Alternately, PLL 10 may be configured such that re-evaluation as described by the embodiment shown in reference to Case4 34 is repeated with some periodicity. Further, re-determination may be initiated from observation of sub-optimal PLL performance, where such observation may be automated.

FIG. 4 is a graph illustrating an exemplary improvement realized through implementation of an embodiment of the present invention for reducing PLL jitter. FIG. 4 includes a graph 401 illustrating the voltage at an input node (e.g., Node_N 19 of FIG. 1) to a voltage-controlled oscillator before implementing improvements described by this invention, as well as a graph 402 illustrating the voltage at an input node to a voltage-controlled oscillator after implementing improvements described by this invention.

As shown by graph 401, the voltage at voltage-controlled oscillator Node_N 19 has much greater variation in comparison to the voltage at voltage-controlled oscillator Node_N 19 shown by graph 402. The voltage at an input node to a voltage controlled oscillator thus varies much less with the leak compensation provided by this invention.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component of any or all the claims.

What is claimed is:

1. A phase-locked loop circuit comprising:
   a phase-frequency divider, wherein the phase-frequency divider is configured to receive a reference input signal and a feedback input signal, and wherein the phase-frequency divider is configured to provide an up output signal and a down output signal;
   a counter holding a value, wherein the value is configured to increment with a pulse received from the phase-frequency divider up output signal and decrement with a pulse received from the phase-frequency divider down output signal;
   a first charge pump, wherein the first charge pump is configured to receive the value from the counter and to provide a first output signal, wherein the first output signal is proportional to the counter value;
   a second charge pump, wherein the second charge pump is configured to receive the up output signal and the down output signal and to provide a second output signal, wherein the second output signal changes according to the up and down output signals; and
   a voltage-controlled oscillator, wherein the voltage-controlled oscillator is configured to receive said first and second output signals.

2. The phase-locked loop circuit as recited in claim 1, further comprising a capacitor, wherein the capacitor is coupled between an input node to the voltage-controlled oscillator and a ground node.

3. The phase-locked loop circuit as recited in claim 2, wherein the counter further comprises a HOLD input port, wherein the counter value remains constant while the HOLD input port is asserted.

4. The phase-locked loop circuit as recited in claim 3, wherein the second charge pump further comprises a STOP input port, wherein the second charge pump is inactive when the STOP input port is asserted.

5. The phase-locked loop circuit as recited in claim 4, further comprising a divider, wherein the divider is configured between an output node of the voltage-controlled oscillator and a feedback input node of the phase-frequency divider.

6. The phase-locked loop circuit as recited in claim 1, wherein the phase-locked loop circuit is of a process technology having gate oxide thickness of less than about 10 angstroms.

7. The phase-locked loop circuit as recited in claim 1, wherein the phase-locked loop circuit is of a process technology having a minimum half pitch of less than about 90 nm.

8. A phase-locked loop circuit comprising:
a phase-frequency divider operable to provide an up output signal and a down output signal;
a counter operable to hold a counter value, wherein the counter value is based upon the up output signal and the down output signal provided by the phase-frequency detector;
a first charge pump comprising a first output signal proportional to the counter value; and
a voltage-controlled oscillator comprising an input node, wherein the first output of the charge pump is coupled to the input node.

9. The phase-locked loop circuit as recited in claim 8, wherein the counter comprises a HOLD input port such that the counter value is constant when the HOLD input port is asserted.

10. The phase-locked loop circuit as recited in claim 9, wherein the phase-locked loop is configured to substantially compensate a current loss from an input node of a voltage-controlled oscillator.

11. The phase-locked loop circuit as recited in claim 10, further comprising:
a gate capacitor arranged between the input node of the voltage-controlled oscillator and a ground node, wherein the gate capacitor comprises a gate-leak current, and wherein the current loss from the input node of the voltage-controlled oscillator comprises the gate-leak current.

12. The phase-locked loop circuit as recited in claim 8, wherein said counter value is configured to increment with the up output signal and decrement with the down output signal, wherein said counter comprises a HOLD input port, and wherein said incrementing and decrementing occur when said HOLD input port is un-asserted.

13. The phase-locked loop circuit as recited in claim 12, further comprising a second charge pump, wherein the second charge pump receives as inputs the up output signal and the down output signal, and wherein the second charge pump provides a second output signal to the input node of the voltage-controlled oscillator.

14. The phase-locked loop circuit as recited in claim 13, wherein the second charge pump further comprises a STOP input port such that the second output is substantially zero when STOP is asserted.

15. The phase-locked loop circuit as recited in claim 14, further comprising a gate capacitor arranged between the input node of the voltage-controlled oscillator and a ground node, and wherein the capacitor contributes to the current loss at the input node to the VCO.

16. The phase-locked loop circuit as recited in claim 8, wherein the phase-locked loop circuit is of a process technology having gate oxide thickness of less than about 10 angstroms.

17. The phase-locked loop circuit as recited in claim 8, wherein the phase-locked loop circuit is of a process technology having a minimum half pitch of less than about 90 nm.

18. A compensation charge pump for providing a compensating current to a phase-locked loop circuit, the compensation charge pump comprising:
a counter operable to hold a counter value where the counter value can be incremented or decremented; and
a first charge pump configured to:
receive the counter value;
generate a first electrical output signal proportional to the counter value; and
provide the first electrical output signal to the phase-locked loop circuit in order to compensate a current loss in the phase-locked loop circuit.

19. The compensation charge pump as recited in claim 18, wherein the counter is configured to maintain a constant counter value when a HOLD input signal is asserted.

20. The compensation charge pump as recited in claim 19, wherein the phase-locked loop circuit provides a signal causing the counter value to increment or decrement.

21. The compensation charge pump as recited in claim 20, wherein the current loss comprises a current loss from an input node of a voltage-controlled oscillator.

22. The compensation charge pump as recited in claim 18, wherein the compensation charge pump is of a process technology having gate oxide thickness of less than about 10 angstroms.

23. The compensation charge pump as recited in claim 18, wherein the compensation charge pump is of a process technology having a minimum half pitch of less than about 90 nm.

24. A method for configuring a phase-locked loop circuit comprising:
providing a phase-frequency divider, wherein the phase-frequency divider is configured to receive a reference input signal and a feedback input signal, and wherein the phase-frequency divider is configured to provide an up output signal and a down output signal;
providing a counter holding a value, wherein the value is configured to increment with a pulse received from the phase-frequency divider up output signal and decrement with a pulse received from the phase-frequency divider down output signal;
providing a first charge pump, wherein the first charge pump is configured to receive the value from the counter and to provide a first output signal, wherein the first output signal is proportional to the counter value;
providing a second charge pump, wherein the second charge pump is configured to receive the up output signal and the down output signal and to provide a second output signal, wherein the second output signal changes according to the up and down output signals; and providing a voltage-controlled oscillator, wherein the voltage-controlled oscillator is configured to receive said first and second output signals.

25. The method as recited by claim 24, further comprising:

operating the first charge pump until the phase-locked loop circuit achieves a locked state; and holding the counter value constant when the locked state is achieved.

26. The method as recited by claim 25, further comprising achieving the locked state at least twice before holding the counter value constant.

27. The method as recited by claim 26, further comprising operating the second charge pump until the phase-locked loop circuit achieves a locked state.

28. The method as recited by claim 26, wherein said achieving the locked state at least twice comprises achieving the locked state at least once while the first charge pump is not active.

29. The method as recited by claim 26, wherein said achieving the locked state at least twice further comprises achieving the locked state at least once while the first charge pump and the second charge pump are active.

30. The method for configuring a phase-locked loop circuit as recited in claim 24, wherein the phase-locked loop circuit is of a process technology having gate oxide thickness of less than about 10 angstroms.

31. The method for configuring a phase-locked loop circuit as recited in claim 24, wherein the phase-locked loop circuit is of a process technology having a minimum half pitch of less than about 90 nm.

* * * * *